(12) United States Patent
Suzuki et al.

(10) Patent No.: US 7,453,549 B2
(45) Date of Patent: Nov. 18, 2008

(54) RETICLE PROTECTION MEMBER, RETICLE CARRYING DEVICE, EXPOSURE DEVICE AND METHOD FOR CARRYING RETICLE

(75) Inventors: Motoko Suzuki, Fukaya (JP); Yukiharu Okubo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 503 days.

(21) Appl. No.: 11/235,198

(22) Filed: Sep. 27, 2005

(65) Prior Publication Data
US 2007/0206173 A1    Sep. 6, 2007

(30) Foreign Application Priority Data
Oct. 29, 2004   (JP)   ............................ 2004-315250
Nov. 19, 2004   (JP)   ............................ 2004-335348

(51) Int. Cl.
H01L 21/027   (2006.01)
(52) U.S. Cl. .............................. 355/30; 355/53; 355/75
(58) Field of Classification Search .................. 355/30, 355/53, 75
See application file for complete search history.

(56) References Cited

U.S. PATENT DOCUMENTS

| | | | |
|---|---|---|---|
| 5,909,030 A | 6/1999 | Yoshitake et al. | |
| 6,090,176 A | 7/2000 | Yoshitake et al. | |
| 6,239,863 B1 | 5/2001 | Catey et al. | |
| 6,281,510 B1 | 8/2001 | Yoshitake et al. | |
| 6,317,479 B1 | 11/2001 | Chiba et al. | |
| 6,452,661 B1 | 9/2002 | Komatsuda | |
| 6,646,720 B2 | 11/2003 | Ramamoorthy et al. | |
| 6,728,332 B2 | 4/2004 | Chiba et al. | |
| 6,753,945 B2 | 6/2004 | Heerens et al. | |
| 6,826,451 B2 | 11/2004 | del Puerto et al. | |
| 6,833,903 B2 * | 12/2004 | Kamono ...................... 355/30 | |
| 6,906,783 B2 | 6/2005 | del Puerto et al. | |
| 6,912,043 B2 | 6/2005 | Galburt | |
| 2003/0162101 A1 | 8/2003 | Heerens et al. | |
| 2003/0227605 A1 | 12/2003 | del Puerto et al. | |
| 2005/0057740 A1 | 3/2005 | del Puerto et al. | |
| 2005/0117142 A1 | 6/2005 | Heerens et al. | |
| 2005/0231707 A1 | 10/2005 | Galburt | |

FOREIGN PATENT DOCUMENTS

JP   S62-180833   8/1987

(Continued)

*Primary Examiner*—Kiet T Nguyen
(74) *Attorney, Agent, or Firm*—Finnegan, Henderson, Farabow, Garrett & Dunner

(57) ABSTRACT

A position measurement device 29 measures the position of a position measurement mark 26 formed on the lower surface of a reticle 1, thereby measuring the position of the reticle 1. A position measurement device 30 measures the position of the position measurement mark 27 formed on the lower surface of a lower lid 2b, thereby measuring the position of the lower lid 2b. The relative displacement of the reticle 1 and lower lid 2b is known when the position of the reticle 1 and the position of the lower lid 2b are known. Therefore, when the lower lid 2b having the reticle 1 loaded thereon is carried with a carrying device and set in an exposure device, the stop position of the lower lid 2b is determined by taking this displacement into account. As a result, the reticle 1 can be correctly set in the exposure device.

14 Claims, 12 Drawing Sheets

FOREIGN PATENT DOCUMENTS

| | | |
|---|---|---|
| JP | H03-142467 | 12/1991 |
| JP | H05-323583 | 12/1993 |
| JP | H09-138498 | 5/1997 |
| JP | H10-055944 | 2/1998 |
| JP | H10-261560 | 9/1998 |
| JP | 2005-129959 | 5/2005 |

* cited by examiner

RETICLE PROTECTION MEMBER, RETICLE CARRYING DEVICE, EXPOSURE DEVICE AND METHOD FOR CARRYING RETICLE

BACKGROUND OF THE INVENTION

The present invention relates to a reticle protection member, a reticle-carrying device, an exposure device, and a method for carrying a reticle, with specific advantageous applications to EUV exposure devices.

Following recent miniaturization of semiconductor integrated circuits, projection lithography technology using EUV light with a shorter wavelength (11-14 nm) instead of conventional ultraviolet radiation has been developed with the object of increasing the resolution of optical systems restricted by a light diffraction limit. This technology has recently been called EUV (Extreme UltraViolet) lithography and it is expected to provide a resolution of 70 nm or less that could not be realized with conventional optical lithography using light radiation with a wavelength of about 190 nm.

A complex index of refraction, n, of a substance in a wavelength region of the EUV light is represented by $n=1-\delta-ik$ (i is a complex symbol). The imaginary portion k of this index of refraction represents absorption by extreme ultraviolet radiation. Because $\delta$ and k are much smaller than 1, the index of refraction in this region is very close to 1. Therefore, an optical system using reflection can be employed without using the conventional optical elements of a transmission refraction type such as lenses.

FIG. 12 is a general view of such an EUV exposure device. EUV light 32 emitted from an EUV light source 31 enters an illumination optical system 33, becomes an almost parallel light flux after being reflected by a concave reflective mirror 34 acting as a collimator mirror, and enters an optical integrator 35 comprising a pair of fly-eye mirrors 35a and 35b. For example, fly-eye mirrors disclosed in U.S. Pat. No. 6,452,661 can be used as the pair of fly-eye mirrors 35a and 35b. The structure and operation of fly-eye mirrors is described in greater detail in U.S. Pat. No. 6,452,661 and the explanation thereof is omitted.

An essentially extended light source having the prescribed shape is formed in the vicinity of the reflective surface of the second fly-eye mirror 35b, that is, in the vicinity of the outgoing surface of the optical integrator 35. The light from the essentially extended light source is deflected by a plane reflective mirror 36 and then forms an illumination region in the form of a narrow long circular arc on a reticle R (an aperture plate for forming the illumination region in the form of a circular arc is not shown in the figure). Light from the pattern of the illuminated reticle R forms an image of the reticle pattern on a wafer W via a projection optical system PL comprising a plurality of reflective mirrors (six reflective mirrors Ml to M6 are shown as an example in FIG. 12). The reticle R is held on a reticle stage, the wafer W is held on a wafer stage, and the entire pattern image of the reticle R surface is transferred on the wafer W by moving (scanning) the reticle stage and wafer stage.

SUMMARY OF THE INVENTION

Because the EUV radiation is also absorbed by air, a high vacuum must be maintained in the barrel, and a special configuration is required for a reticle carrying system.

Furthermore, reflection-type reticles are also employed in such EUV exposure devices. A transparent thin film called a pericle is used for protecting the pattern surface in reticles in the convenient exposure devices using the visible or ultraviolet radiation. However, because transparent materials are not used in the EUV exposure devices, as described hereinabove, a pericle cannot be formed and the pattern surface is exposed. Therefore, when the reticle is carried or stored, the pattern surface has to be protected with separate means to prevent foreign matter from adhering thereto.

Furthermore, when the reticle is carried, if the reticle is carried directly with a carrying device, there is a risk of the pattern surface being damaged by contact between the reticle and the carrying device or dust being generated by rubbing against the portions other than the pattern surface. Therefore, it is preferred that a method be employed in which the protective member is carried in a state in which the reticle is protected by the protective member.

However, if a mutual arrangement of the reticle and protective member changes in a method of carrying the protective member that protects the entire reticle or patterned surface, when the protective member is carried to the reticle stage and the reticle is then mounted on the reticle stage, it is sometimes impossible to mount the reticle in an appropriate position.

With the foregoing in mind, it is an object of the present invention to provide a reticle carrying device capable of mounting the reticle in an appropriate position when the reticle is carried and mounted on a reticle stage of an exposure device even if a reticle protection member is provided for protecting the entire reticle or a patterned surface thereof, a reticle protective member suitable for this purpose, an exposure device having such a reticle carrying device, and a method for carrying the reticle that can achieve this object.

According to a first aspect of the invention, the present invention relates to a reticle protection member for protecting at least part of a reticle to be used in an exposure device, this reticle protection member comprising an alignment mark for detecting its position.

Because the reticle protection member is provided with a mark for detecting its position, it can be used as a reticle protection member employed in the device described below.

According to a second aspect of the invention, the present invention relates to the reticle protection member, wherein the reticle, which is the protection object, is a reflective-type reticle in which a pattern is formed on one surface, the reticle protection member comprises a first member for protecting the surface of the reticle where the pattern was formed and a second member for protecting the surface opposite that where the pattern was formed, and the first and second members are provided with respective alignment marks.

In this case, the reticle can be accommodated and protected between the first member and second member. Because each member is provided with a respective mark, their respective positions can be detected independently.

According to a third aspect of the invention, the present invention relates to the reticle protection member, wherein the reticle, which is the protection object, is a reflective-type reticle in which a pattern is formed on one surface, and the reticle protection member protects at least the region where the pattern was formed of the surface of the reticle where the pattern was formed.

In the reflective-type reticles, the surface where a pattern has not been provided and a region where a pattern has not been provided are not always required to be protected. Therefore, with the present device, the number of members is reduced and the structure is simplified. Furthermore, when regions exist in which dust adhesion can be a problem, such as alignment marks or ID marks, even outside the pattern formation region, it is preferred that those regions also be protected.

According to a fourth aspect of the invention, the present invention relates to a reticle carrying device for carrying a reticle, comprising reticle carrying means for carrying a reticle covered with a reticle protection member for protecting at least part of the reticle, first position measurement means for measuring the position of the reticle, and second position measurement means for measuring the position of the reticle protection member.

With such a configuration, because the position of the reticle is measured with the first position measurement means and the position of the reticle protection member is measured with the second position measurement means, the mutual arrangement of the reticle and protection member can be determined.

When the reticle is transported together with at least part of the protection member, because the carrying means holds and carries the protection member, for example, the alignment of the reticle with respect to the carrying destination site such as a reticle stage of an exposure device is conducted with the carrying device holding the protection member.

Because the mutual arrangement of the reticle and protective member can be determined, a position to which the protection member may be carried in order to position the reticle accurately in the carrying destination site is clarified and, therefore, the reticle can be accurately positioned in the carrying destination site.

According to a fifth aspect of the invention, the present invention relates to the reticle carrying device, wherein the reticle, which is the protection object, is a reflective-type reticle in which a pattern is formed on one surface, the reticle protection member comprises a first member for protecting the surface of the reticle where the pattern was formed and a second member for protecting the surface opposite that where the pattern was formed, and the second position measurement device independently measures the positions of the first member and second member.

With such a configuration, not only the surface where the pattern was formed, but also the surface where the pattern was not formed can be protected with the protection member, and the protection becomes complete.

According to a sixth aspect of the invention, the present invention relates to the reticle carrying device, wherein the reticle, which is the protection object, is a reflective-type reticle in which a pattern is formed on one surface, and the reticle protection member protects at least the region where the pattern was formed of the surface of the reticle where the pattern was formed.

With such configuration, at least the region where the pattern was formed of the surface where the pattern was formed is protected by the protection member. Therefore, the configuration of the protection member is simplified.

According to a seventh aspect of the invention, the present invention relates to the reticle carrying device comprising position correction means for correcting the positions of the reticle protection member and reticle based on the position of the reticle and position of the reticle protection member measured with the first position measurement means and second position measurement means.

With such a configuration, because the reticle carrying device comprises the position correction means for correcting the positions of the reticle protection member and reticle based on the position of the reticle and position of the reticle protection member measured with the first position measurement means and second position measurement means, the position of the reticle and the position of the reticle protection member are corrected before the reticle (including when the reticle is carried together with the reticle protection member) is carried to the reticle stage, and when the reticle has been carried to the reticle stage in the sequence of determined carrying means, the reticle can be positioned in the appropriate position on the reticle stage. Furthermore, the position correction means may have a function of correcting the position of at least one of the reticle protection member and reticle.

When the carrying means itself has the position correction function, it is not necessary to provide a special position correction means. In this case, the two means are combined and the carrying means also serves as the position correction means.

According to an eighth aspect of the invention, the present invention relates to the reticle carrying device, comprising position correction means for correcting the positions of the first member and the reticle based on the position of the reticle and position of the reticle protection member measured with the first position measurement means and second position measurement means.

According to a ninth aspect of the invention, the present invention relates to the reticle carrying device, wherein the reticle carrying means serves to carry the reticle protected by the reticle protection member to the reticle stage and to carry the reticle protection member from the reticle stage to another location after the reticle has been loaded on the reticle stage, and has a function of conducting the position correction of the reticle and the reticle protection member or the first member with the position correction means before the reticle is loaded on the reticle stage.

Using such a configuration, the reticle protection member has a function of conducting the position correction of the reticle and the reticle protection member or the first member with the position correction means before the reticle is loaded on the reticle stage. Therefore, when the reticle has been carried to the reticle stage in the sequence of determined carrying means, the reticle can be positioned in the appropriate position on the reticle stage. Furthermore, the reticle position correction is not limited to where it is conducted in the alignment stage and also includes the case where it is conduced by changing the carrying target position of the carrying means.

According to a tenth aspect of the invention, the present invention relates to the reticle carrying device, wherein the reticle carrying means has a function of carrying the reticle protection member to the reticle stage, protecting the reticle with the reticle protection member, and then carrying the reticle protection member and reticle to recover the reticle from the reticle stage and a function of measuring the position of the reticle protection member with the second measurement means before the reticle protection member is carried to the reticle stage.

With such a configuration, the position of the reticle protection member is measured in advance, then the reticle protection member is carried to the reticle stage, and the reticle is protected with the reticle protection member. In this case, because the position of the reticle protection member is measured in advance, the reticle and reticle protection member can be accurately positioned, and damage caused by abnormal contact or generation of dust can be prevented.

According to an eleventh aspect of the invention, the present invention relates to the reticle carrying device having a function of measuring the positions of the first member and second member and then aligning the first member and the second member and combining them based on the measurement results.

Measuring the positions of the first member and second member and then aligning the first member and the second member and combining them based on the measurement results can prevent damage caused by abnormal contact or generation of dust. The first member and second member are sometimes combined not only when the reticle has been protected, but also when it has not been protected. This is done to prevent dust from entering between the first member and second member when they are, for example, the lower lid and upper lid.

According to a twelfth aspect of the invention, the present invention relates to an exposure device comprising the reticle-carrying device described above.

In the exposure device, when the reticle has been carried to the reticle stage, it can be accurately positioned in it and the reticle can be held in this state in the reticle stage. As a result, the mark detection range of the reticle alignment device loaded on the reticle stage can be relatively narrowed and the mark detection time can be shortened.

According to the a thirteenth aspect of the invention, the present invention relates to a method for carrying a reticle to be used in an exposure device, by which a reticle covered with a reticle protection member for covering at least part is removed from the protection member and carried to a reticle stage of the exposure device, the method comprising a step of measuring the position of the reticle and the position of the reticle protection member before the reticle is removed, in the course of carrying, from the reticle protection member.

With such a configuration, when the reticle has been carried to the reticle stage, it can be accurately positioned therein and the reticle can be held in this state in the reticle stage. The reticle can be removed either before or after the reticle is loaded on the reticle stage. The above-described operations can be performed as modifications or applications, or those operations can be added.

According to the present invention, there can be provided a reticle carrying device capable of placing the reticle in an appropriate position when the reticle is carried and placed on a reticle stage of an exposure device even when a reticle protection member is provided for protecting the entire reticle or a patterned surface, a reticle protective member suitable for use for this purpose, an exposure device having such a reticle carrying device, and a method for carrying the reticle that can attain this object.

DETAILED DESCRIPTION OF THE PREFERRED EMBODIMENT

Figure 1:
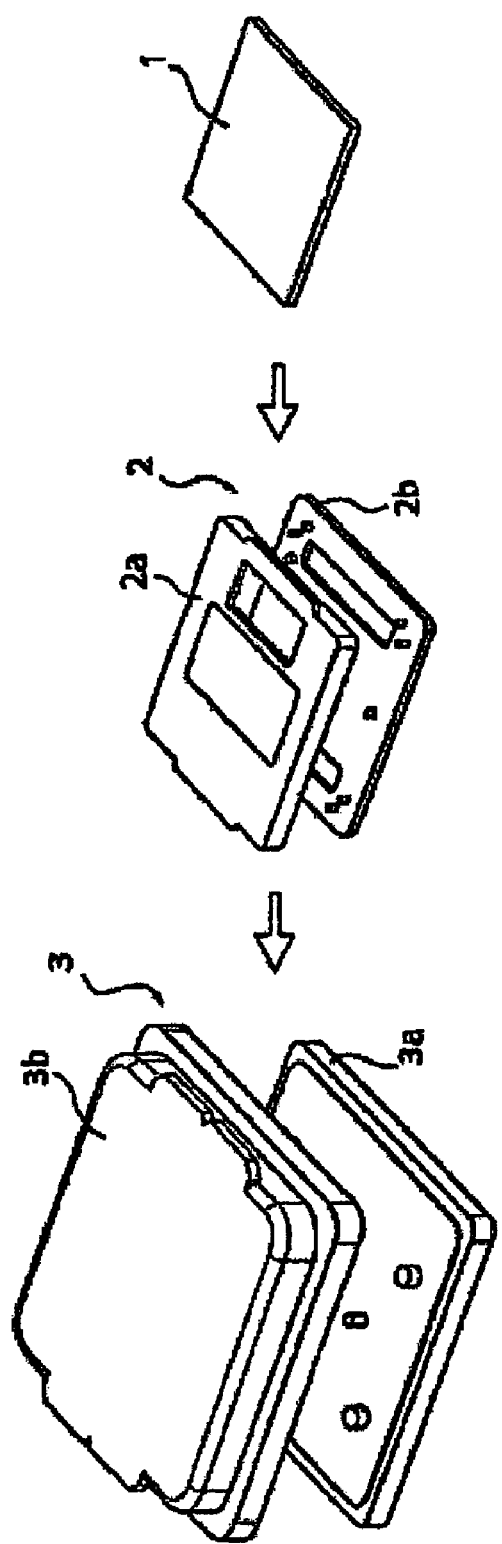
FIG. 1 is a general view illustrating the relationship between the reticle, clean filter pod (CFP), and reticle carrier (RSP).

An example of the preferred embodiment of the present invention will be explained below with reference to the appended drawings, but the present invention is not limited to this example. First, the relationship between a reticle and a reticle protection member, on which the embodiment of the present invention is premised, will be explained. FIG. 1 is a schematic drawing illustrating the relationship between a reticle, a clean filter pod (CFP), which is a reticle protection member, and a reticle carrier (also called RSP: reticle SMIF pod).

A reticle 1 is accommodated in a clean filter pod 2 having an upper lid 2a and a lower lid 2b, so that it is sandwiched between the upper lid 2a and lower lid 2b and protected thereby. Furthermore, the clean filter pod 2 is accommodated inside a reticle carrier 3 having a base 3a and a cover 3b. The reticle carrier 3 is sometimes also called a reticle SMIF pod (RSP). A plurality of clean filter pods 2 are sometimes accommodated inside the reticle carrier 3, but in the following explanation of the embodiment, an example will be considered in which one clean filter pod is accommodated.

Figure 2:
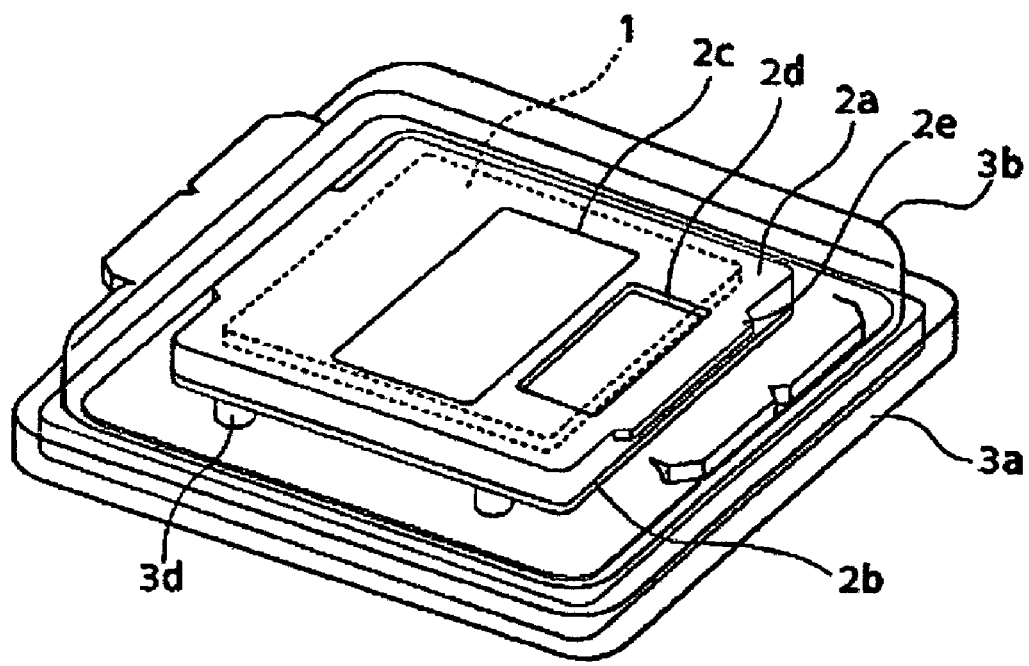
FIG. 2 is an assembly diagram of the reticle, clean filter pod (CFP), and reticle carrier (RSP).
Figure 3:
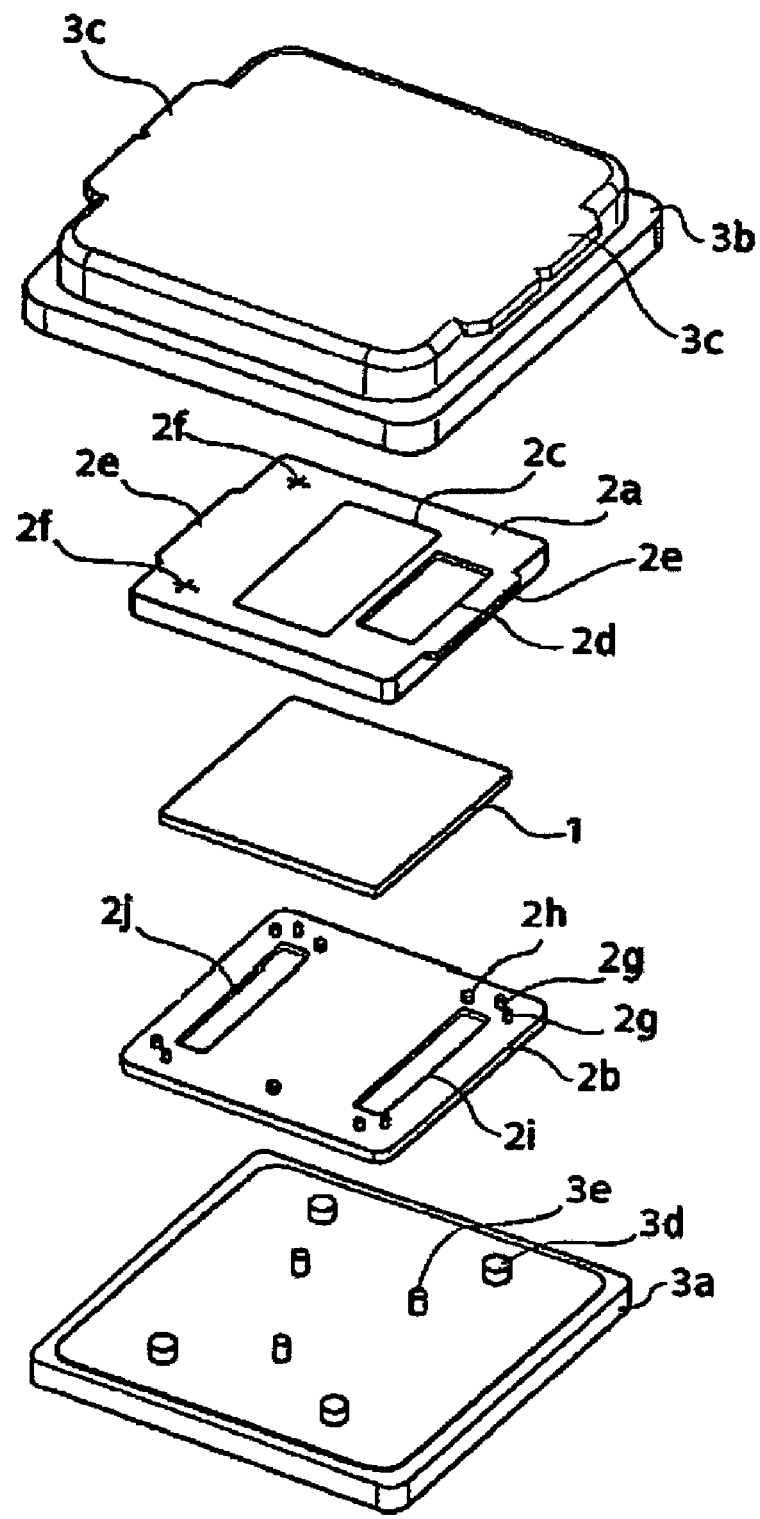
FIG. 3 is an exploded perspective view of the configuration shown in FIG. 2.

FIG. 2 is an assembly drawing illustrating the state in which the reticle 1 is thus accommodated inside the clean filter pod 2 and the clean filter pod 2 is accommodated in the reticle carrier 3. FIG. 3 is an exploded perspective view thereof. In the figures described below, the structural elements identical to the structural elements shown in the aforementioned figures will be assigned with identical symbols and the explanation thereof will be omitted.

The cover 3b is from a transparent resin. Protruding sections 3c that will be grabbed and raised by an air robot 12 when the reticle carrier 3 is carried are provided in two places.

The upper lid 2a is usually formed from a metal such as aluminum, has a filter 2c and also has a transparent window 2d formed from glass or the like. The filter 2c serves to ensure sufficient conductance, while preventing the penetration of fine particles such as dust. Furthermore, even when the upper lid 2a and lower lid 2b of the clean filter pod 2 are engaged and an internal space is formed, the filter reduces the difference in air pressure between the outside and the internal space and prevents a force caused by the difference in pressure from being applied to the upper lid 2a and lower lid 2b. As described below, because the clean filter pod 2 is carried through atmosphere and space under high vacuum, the internal pressure regulating mechanism employing such a filter is necessary. The transparent window 2d makes it possible to observe the state of the reticle 1 from the outside.

Protruding sections 2e are provided in two places, on the left and right side as shown in the figure, on the upper lid 2a. As described hereinabove, they are used for separating the upper lid 2a and lower lid 2b by grabbing and holding those sections with holding members and lowering the lower lid 2b down. Furthermore, a position detection mark 2f for detecting the position of the upper lid 2a is provided thereon and, as explained herein below, the position of the upper lid 2a is detected by measuring the position of the mark with a position measurement apparatus.

The lower lid 2b is usually formed from a metal such as aluminum and has two pairs of alignment pins 2g provided in four corners thereof. When the reticle 1 is held, the alignment of the reticle 1 in the plane direction is conducted with the alignment pins 2g. Furthermore, projections 2h for holding the reticle are provided in three places, and the reticle 1 is supported in three points by the projections 2h for supporting the reticle.

Furthermore, two transmitting windows 2i, 2j made from glass or the like are provided in the lower lid 2b in order to enable the observation of an ID mark or a mark formed on the reticle 1 from below the lower lid 2b in the reticle position measurement device which is the main component according to the present invention. In the figure, they are provided in two locations, but if the position of the alignment mark formed on the reticle 1 is fixed, they may be provided in one location.

Three pins 3e to be loosely fitted into the holes provided in the lower lid 2b (in FIG. 3, the holes are provided on the rear side and are not seen in the figure) are provided in the base 3a, thereby ensuring coarse alignment of the lower lid 2b and base 3a. Projections 3d for four-point supporting the lower lid 2b are also provided in the base 3a.

A mark for position measurement is provided in the lower lid 2b in the same manner as in the upper lid 2a; in the configuration shown in FIG. 3, the mark is provided on the rear side and is not seen in the figure. A mark for position measurement is also provided in the reticle 1; it is also provided on the rear side and is not seen in the figure. The lower surface of the reticle 1 is a patterned surface. As a result, the adhesion of dust or the like under gravity to the surface where the pattern was formed is effectively prevented.

The reticle 1 is carried to the reticle carrying device after being double accommodated in the clean filter pod 2 and reticle carrier 3, as shown in FIG. 2. The reticle-carrying device of the embodiment of the present invention will be overviewed below.

Figure 4:
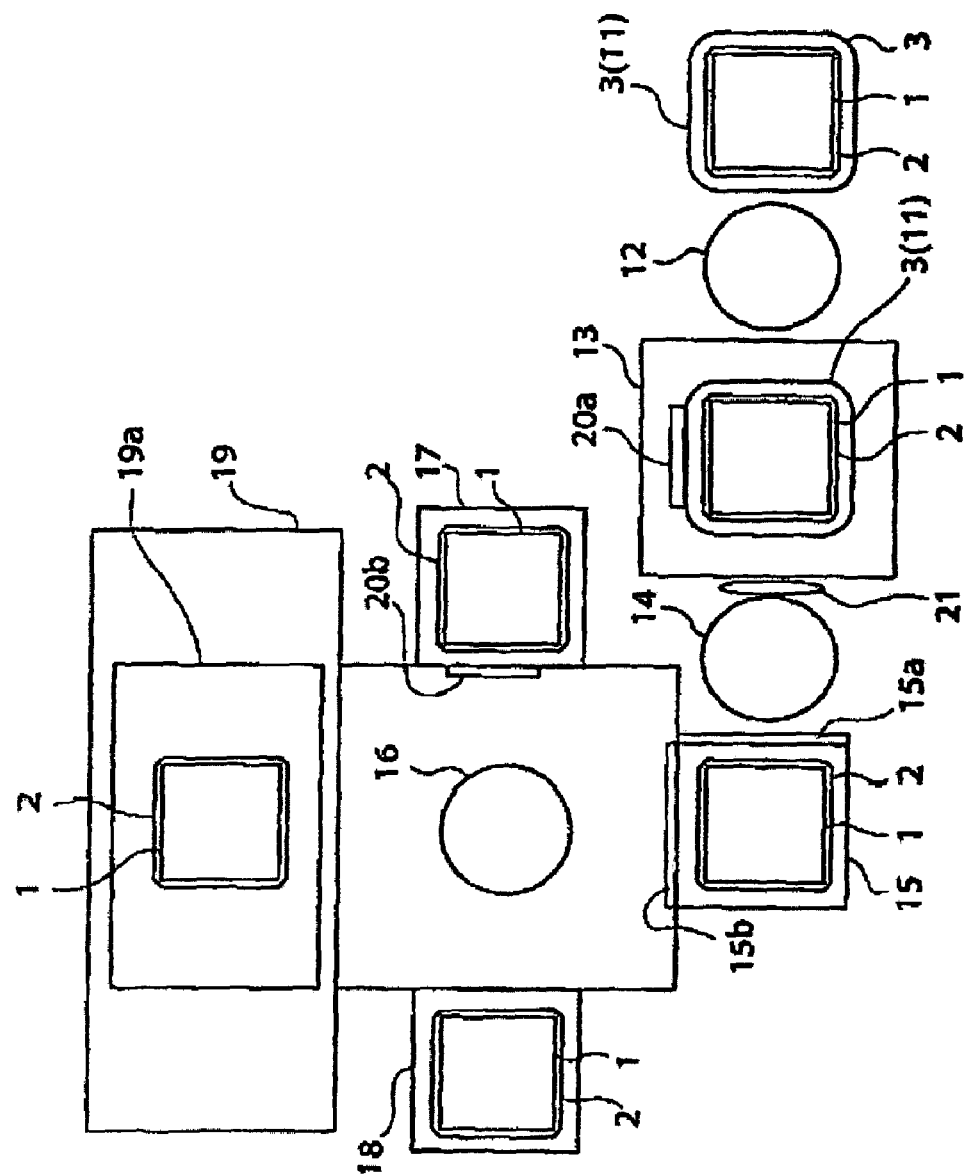
FIG. 4 is a schematic drawing illustrating the general view of the reticle carrying device that is an example of the preferred embodiment of the present invention and an exposure device.

FIG. 4 is a schematic drawing illustrating the general view of the reticle carrying device that is an example of the embodiment of the present invention and an exposure device. The reticle 1 that was carried from the outside is accommodated in an air reticle stocker 11. Alternatively, it is carried in after being accommodated in the air reticle stocker 11. Then, it is carried with an air robot 12 to the reticle carrier opener 13, and the clean filter pod 2 is removed in clean atmosphere inside the reticle carrier opener 13 from inside the reticle carrier. Then, the clean filter pod 2 is removed with an air robot 14 and carried into a load lock chamber 15. A path between the load lock chamber 15 comprising the air robot 14 and the reticle carrier opener 13 is under clean atmosphere.

The inside of the load lock chamber 15 is then evacuated and a vacuum state is attained inside the load lock chambers 15 and the clean filter pod 2. Once the evacuation has been completed, the clean filter pod 2 is removed from the side of the load lock chamber 15 with a vacuum robot 16. Thus, two doors 15a, 15b are provided in the load clock chamber 15. When the load lock chamber 15 is in an air open state, the door 15b is closed, the door 15a is open, and the clean filter pod 2 is carried in from inside the reticle carrier opener 13. Then, the door 15a is closed, evacuation is conducted, and once the evacuation has been completed, the door 15b is opened, and the clean filter pod 2 is removed with the vacuum robot 16 into the vacuum region.

The clean filter pod 2 that was carried into the vacuum region is carried into a vacuum reticle library 17 and temporarily stored therein. Actually, when the reticle 1 is used in an exposure device 19, the clean filter pod 2 accommodating the reticle is removed by the vacuum robot 16 from the vacuum reticle library 17, carried into a CFP opener 18, and the upper lid 2a of the clean filter pod 2 is removed by the CFP opener 18 from the reticle 1 and the lower lid 2b. The CFP opener 18, as described herein below, comprises a pre-alignment mechanism for the reticle 1 and the lower lid 2b.

Then, the reticle 1 that was placed on the lower lid 2b is carried to a reticle stage 19a of the exposure device 19 by the vacuum robot 16. Then, chucking is conducted with an electrostatic chuck of the reticle stage 19a, and the reticle is separated from the lower lid 2b and used for exposure. The separated lower lid 2b is returned by the vacuum robot 16 into the CFP opener 18 and held by the vacuum robot 16 in a stand-by mode till the use of the reticle 1 is completed.

Once the use of reticle 1 has been completed, the vacuum robot 16 carries the lower lid 2b to the reticle stage 19a. If the chucking of the electrostatic chuck is released after the lower lid was stopped in the prescribed location, the reticle 1 is placed on the lower lid 2b. In this state, the vacuum robot 16 carries the lower lid 2b into the CFP opener 18, and the lower lid 2b is covered inside the CFP opener 18 with the upper lid 2a that was heretofore separated. The vacuum robot 16 then returns the clean filter pod 2 into the vacuum reticle library 17 for storage.

When the clean filter pod 2 is removed from the vacuum region, the clean filter pod 2 located in the vacuum reticle library 17 is introduced by the vacuum robot 16 into the load lock chamber 15. Here, after the pressure inside the load lock chamber 15 became the atmospheric pressure, the clean filter pod is returned by the air robot into the reticle carrier opener 13, accommodated in the reticle carrier 3, and stored in the air reticle stocker 11. The desired reticle carrier 3 that has been stored in the air reticle stocker 11 is carried to the outside by an operator or a robot.

In FIG. 4, the reference numeral 20a stands for a reticle carrier ID reader for reading the identification code of the reticle carrier 3 and the reference numeral 20b stands for a reticle ID reader for reading the identification code of the reticle 1 and the clean filter pod 2. The information of the reticle carrier 3, reticle 1, and clean filter pod 2 is read by those readers, the target reticle 1 is supplied to the exposure device, and the reticle 1 removed from the exposure device is accommodated in the prescribed clean filter pod 2 and reticle carrier 3. The reference numeral 21 stands for a temperature compensation lamp for conducting temperature adjustment of the reticle in order to compensate the decrease in temperature occurring when the reticle 1 is vacuum grabbed.

Figure 5:
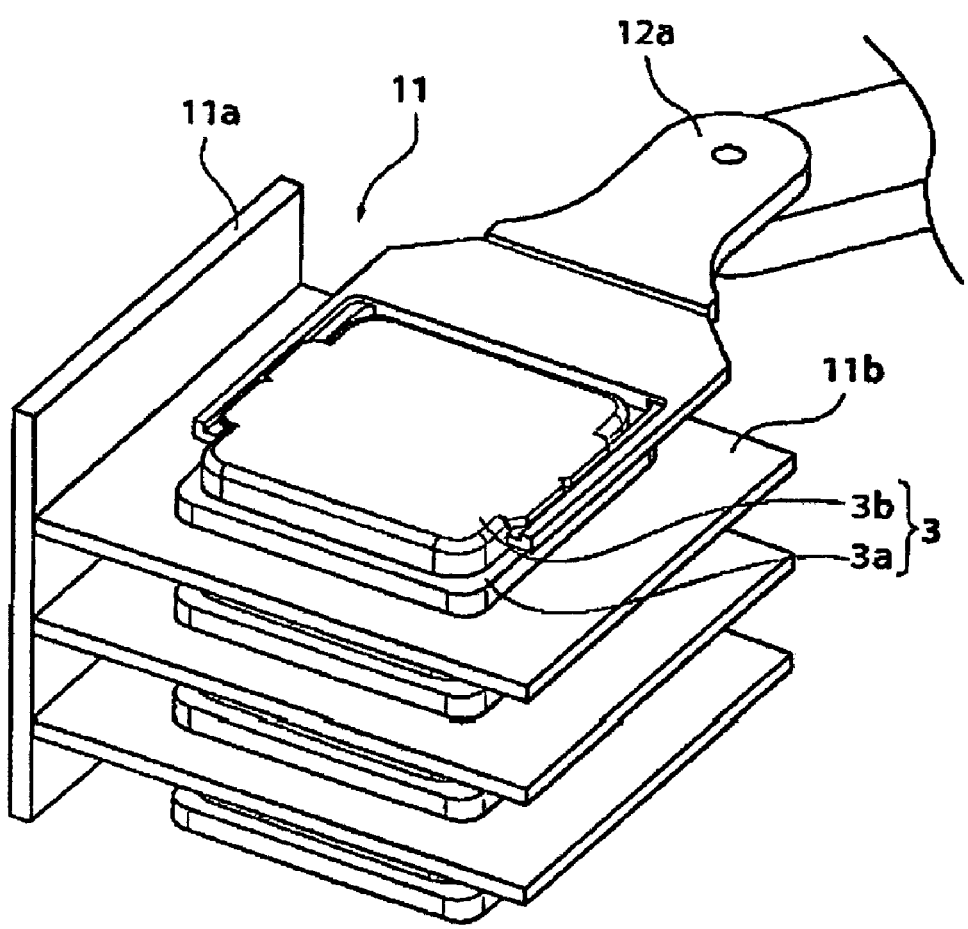
FIG. 5 illustrates how the reticle carrier is removed from the air reticle stocker.
Figure 6:
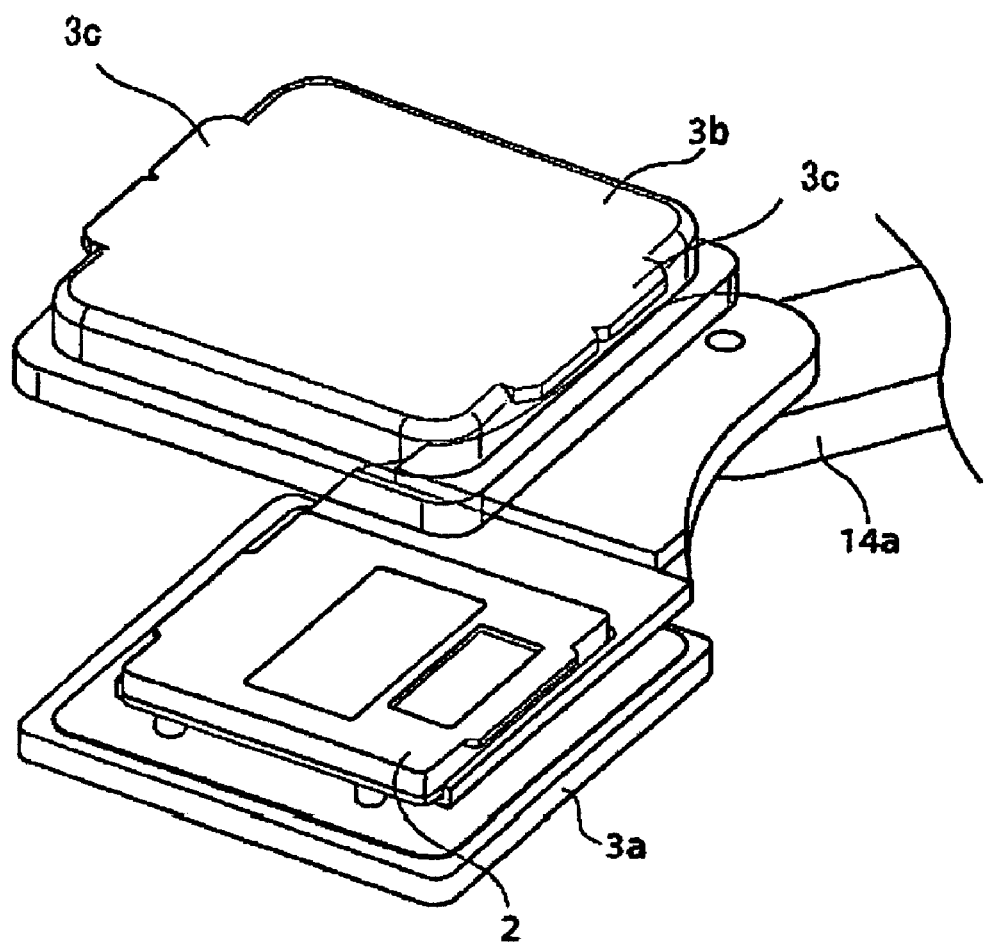
FIG. 6 illustrates how the clean filter pod is removed from the reticle carrier in the reticle carrier opener.

FIG. 5 illustrates how the reticle carrier 3 is removed from the air reticle stocker 11. The air reticle stocker is a rack comprising vertical plates 11a and horizontal plates 11b (another vertical plate 11a is not shown in the figure), and reticle carriers 3 accommodating the reticle 1 and the clean filter pod 2 are placed on each horizontal plate 11b. The reticle carrier 3 having the selected reticle accommodated therein is held by a robot arm 12a of the air robot 12 and carried to the reticle carrier opener 13. The reticle carrier opener 13 has a structure identical to that of the well-known reticle SMIF pod (RSP) and detailed description thereof is herein omitted. FIG. 6 illustrates a state in which the cover 3b of the reticle carrier 3 is separated from the base 3a by the reticle carrier opener 13. The reticle carrier 3 disposed on the upper plate of the reticle carrier 13 by the robot arm 12 is fixed to the housing (not shown in the figure) of the reticle carrier opener 13, and part of the upper plate of the reticle carrier opener 13 and the base 3a are moved together downward, thereby disposing the clean filter pod 2 in the clean atmosphere inside the reticle carrier opener. A robot arm 14a of the air robot 14 enters the reticle carrier opener 13, the clean filter pod 2 that became uncovered in the clean atmosphere after being placed on the base, is seized by the robot arm 14a, removed and accommodated inside the load lock chamber 15. Then, the cover 3b and the base 3a are combined together by again raising the base 3, and the empty reticle carrier is returned to the air reticle stocker 11. Then, the next necessary reticle is selected and carried to the load lock chamber 15 in the same manner as described above.

Figure 7:
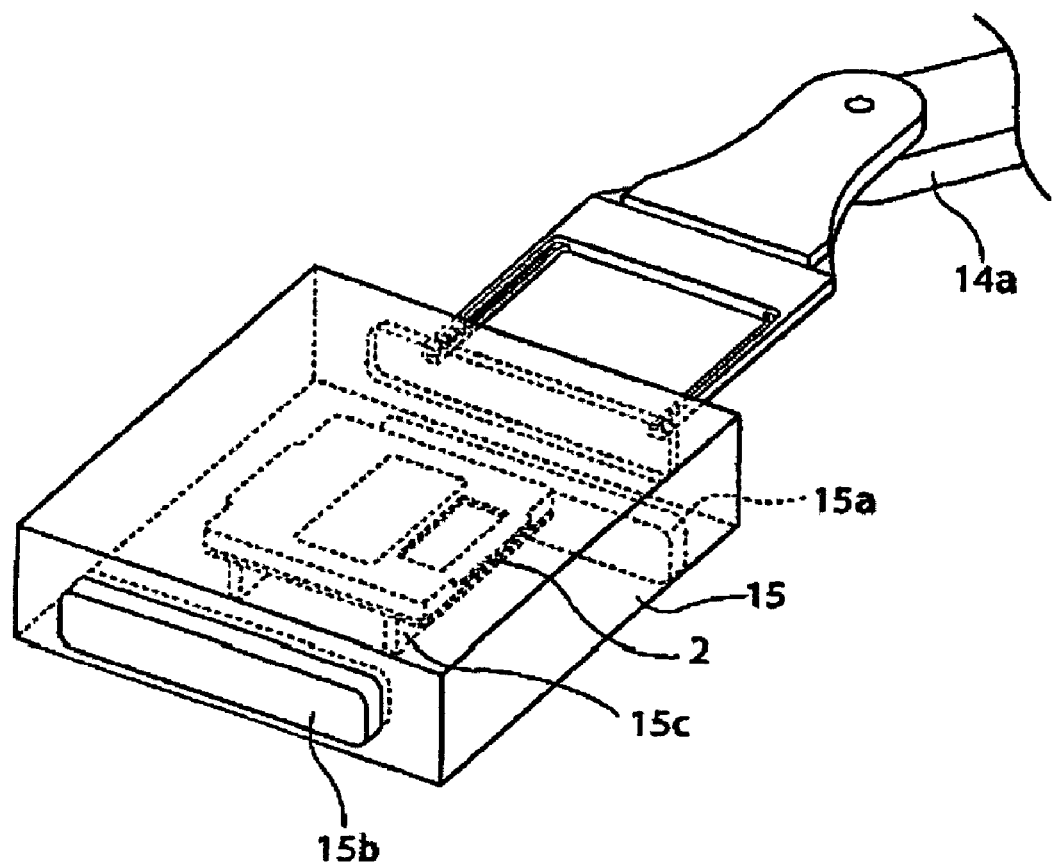
FIG. 7 is a general view of the load lock chamber.

FIG. 7 is a general view of the load lock chamber 15. The figure shows a state in which the door 15a is open and the door 15b is closed. In this state, the clean filter pod 2 that was carried by the robot arm 14a is placed on a stand 15c. From this state, the door 15 is closed, evacuation is conducted, then the door 15b is opened, and the clean filter pod 2 is removed by the vacuum robot 16. Furthermore, the positions of door 15a and door 15b in FIG. 4 and FIG. 7 are different, but this is done merely for the sake of convenience. Any mutual arrangement of those doors may be employed. If the clean filter pod 2 is opened during evacuation, dust can adhere to the reticle. Therefore, it is preferred that the pod 2 be fixed with mechanical means or the like, so as not to be opened when the load lock chamber is evacuated or air is released therefrom.

Figure 8:
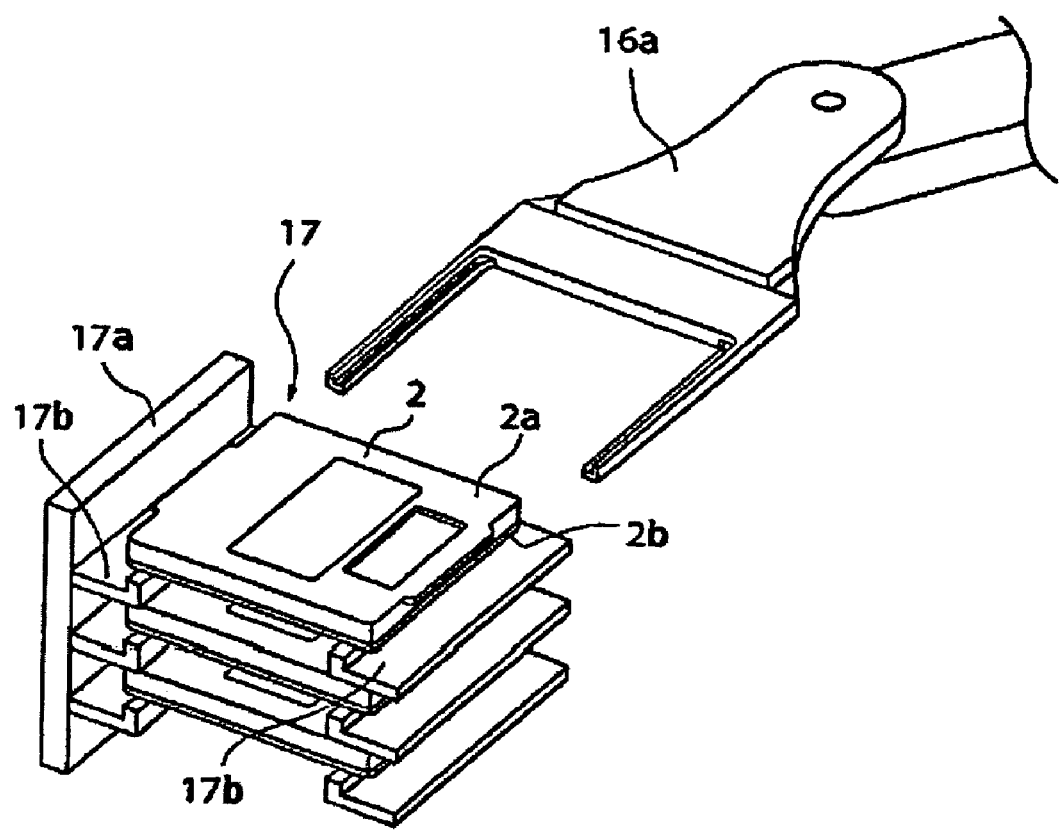
FIG. 8 is a general view of the structure of the vacuum reticle library.

FIG. 8 is a general view of the structure of the vacuum reticle library 17. The vacuum reticle library 17 is a rack comprising vertical plates 17a and horizontal plates 17b (another vertical plate 17a is not shown in the figure), and clean filter pods 2 accommodating the reticles 1 are placed on each horizontal plate 17b. Each horizontal plate 17b has a L-like shape so that the end portions of the clean filter pods 2 are in a floating state and that the distal end portions of the vacuum robot arm 16 can be inserted below the lower lid 2b and scoop up the lower lid 2b.

Figure 9:
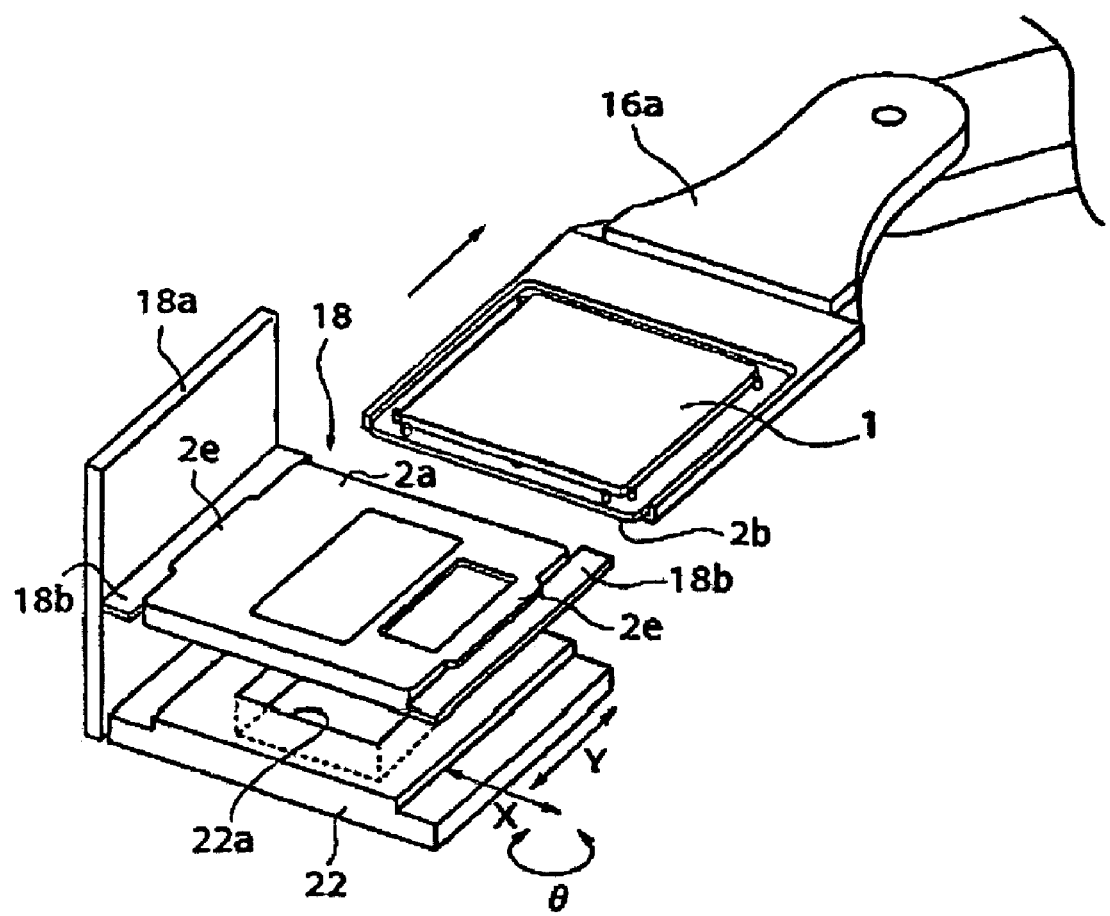
FIG. 9 is a general view illustrating the structure of the CFP opener and a state in which the clean filter pod is separated into the upper lid and lower lid and the reticle is removed after being placed and held on the lower lid.

FIG. 9 is a general view illustrating the structure of a CFP opener 18 and showing a state in which the clean filter pod 2 is separated from the upper lid 2a and lower lid 2b and the reticle 1 is removed in a state in which it is placed on the lower lid 2b.

The CFP opener 18 is a one-stage rack composed of vertical plates 18a and horizontal plates 18b (another vertical plate 18a is not shown in the figure), the protruding sections 2e of the upper lid 2a hang on the horizontal plate 18b and the upper lid 2a is suspended thereon.

If the clean filter pod 2 is lowered from above the horizontal plate 18b in a state in which the lower surface of the lower lid 2b is supported by distal end sections of the vacuum robot arm 16a, the protruding sections 2e of the upper lid 2a are caught by the horizontal plate 18, and if the position of the vacuum robot arm 16a is further lowered, the lower lid 2b and the reticle 1 located thereon fall down, but because the protruding sections 2e of the upper lid 2a hang on the horizontal plate 18b, the upper lid remains held on the horizontal plate 18b, as shown in the figure, and the upper lid 2a, lower lid 2b, and reticle 1 are separated. The reticle 1 that was placed and held on the lower lid 2b can be removed in this state by pulling the vacuum robot arm 16a in the direction shown by an arrow.

An alignment stage 22 is provided on the CFP opener 18. As shown in the figure, the alignment stage 22 can move in the X direction and Y direction perpendicular thereto and also can rotate (θ) in the Z direction perpendicular to those two directions. In the present example, the horizontal plate 18b carrying the upper lid 2a is fixed, but when the position of the upper lid is desired to be adjusted, it can be moved by providing drive means.

When the alignment (position adjustment) of the reticle 1 is wished to be conducted, if the vacuum robot arm 16a is lowered in a state where the lower lid 2b carrying the reticle 1 is sandwiched between the distal end sections of the vacuum robot arm 16a, the lower lid 2b can be placed on the alignment stage 22. The central portion of the alignment stage 22 protrudes forward so that the vacuum robot arm 16a can be lowered to a position such that the distal end section of the vacuum robot arm 16a does not come into contact with the lower lid 2b in a state where the lower lid 2b is placed and held on the alignment stage 22. A through hole 22a is provided in the central portion of the alignment stage 22, but this is done, as described herein below, so that the position of the lower lid 2b and the position of the reticle 1 can be detected with the position detection device.

Figure 10:
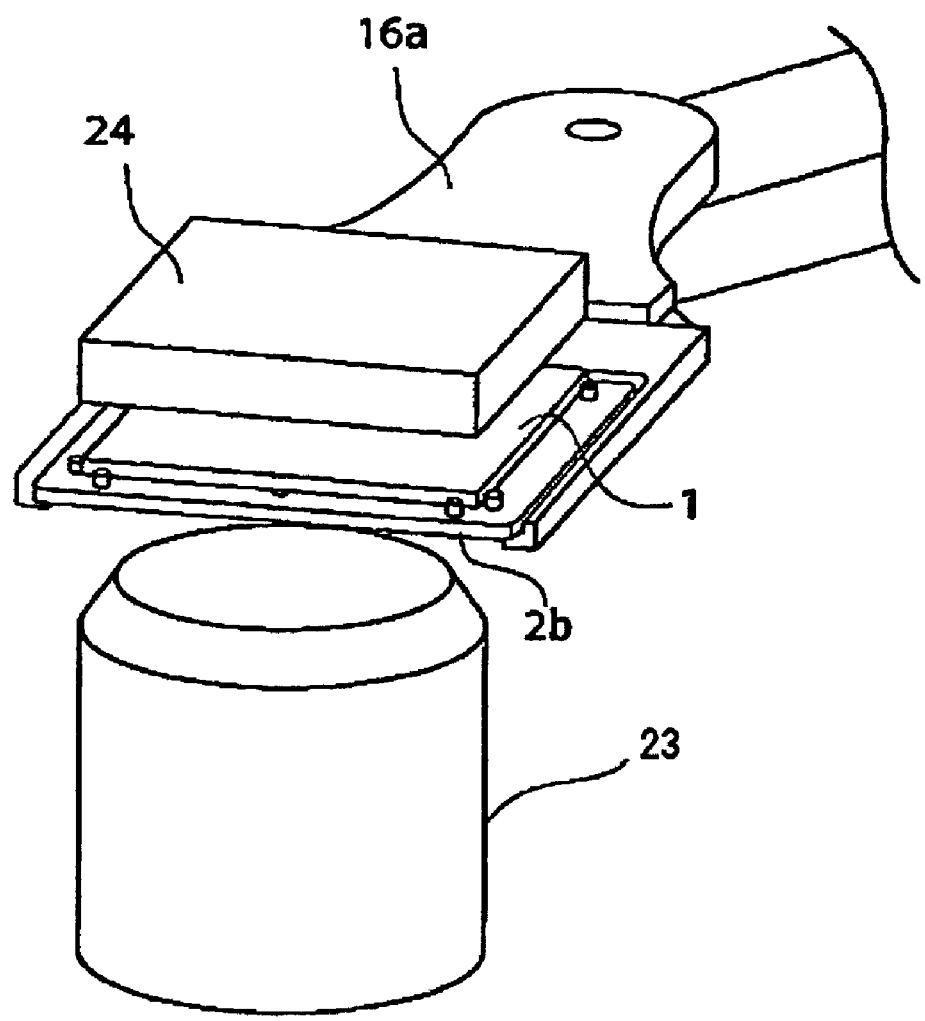
FIG. 10 is a general view illustrating the state in which the reticle and lower lid are carried inside the exposure device.

FIG. 10 is a general view illustrating the state where the reticle 1 and the lower lid 2b were carried into the exposure device. The reference numeral 23 stands for a barrel of the exposure device, and the reference numeral 24 stands for an electrostatic chuck provided on the reticle stage 19a (not shown in FIG. 10) of the exposure device. If the reticle 1 placed and held on the lower lid 2b is carried to the prescribed position by the vacuum robot arm 16a and chucked by the electrostatic chuck 24, only the reticle 1 will be fixed to the reticle stage 19a, and the lower lid 2b will remain held by the vacuum robot arm 16a. In this state, the lower lid 2b is returned into the CFP opener 18 by the vacuum robot arm 16a. It is preferred that prior to chucking with the electrostatic chuck 24 the reticle be pressed against the electrostatic chuck 24 by the vacuum robot or other means.

Thus, till the use of the reticle 1 is completed, the lower lid 2b may be in a stand-by mode inside the CFP opener 18, but in order to prevent dust from entering the lower lid 2b, the upper lid 2a and lower lid 2b may be returned in a mated state, and the empty clean filter pod 2 may be returned to the vacuum reticle library 17 by using the vacuum robot 16 and stored therein.

In this case, when the use of reticle 1 is completed, the corresponding clean filter pod 2 may be identified by the reticle ID reader 20b, removed, and carried to the CFP opener 18, the upper lid 2a and lower lid 2b may be separated by the above-described method and then the lower lid 2b may be moved to the position of the reticle stage 19a by the vacuum robot 16 and the reticle 1 may be received.

With such a configuration, because the vacuum robot 16 becomes free, when the reticle is used for exposure, another reticle can be carried to the vacuum reticle library 17, or the reticle which is next to be used can be aligned.

Furthermore, in the CFP opener 18, the upper lid 2a and lower lid 2b may be mated and held by the vacuum robot arm 16a in a standby mode. In this case, the carrying time can be shortened by comparison with that of the process in which the empty clean filter pod 2 is returned to the vacuum reticle library 17, while preventing dust from entering the lower lid 2b.

A method for recovering the reticle 1 from the reticle stage 19 to the clean filter pod 2 was described above, but the carrying method in which the clean filter pod 2 is accommodated inside the reticle carrier 3 may be conducted inversely to the above-described process of removing the clean filter pod 2 from the reticle carrier 3 and carrying it to the CFP opener 18, and the explanation of this method is not required for a person skilled in the art.

In the configuration explained hereinabove, the clean filter pod 2, which accommodated and protected the reticle 1 inside thereof, was composed of the upper lid 2a and lower lid 2b. However, the protection of the reticle 1 sometimes may be conducted only on the lower surface where the pattern has been formed and only on the region of the lower surface that is wished to be protected, for example, a pattern formation region. In this case, the upper lid 2a is unnecessary and the shape of the lower lid is different. When such a reticle protection member is handled, the structure for separating the upper lid 2a inside the CFP opener 18 is unnecessary and simply the alignment stage 22 for conducting the alignment of the reticle 1 and the below-described position measurement device may be employed. As a result, the configuration of the device is simplified accordingly. In both cases, the alignment stage 22 is sometimes unnecessary when the alignment is conducted with a vacuum robot.

In the explanation provided hereinabove, the vacuum reticle library 17 and CFP opener 18 were separate devices, but they can be combined into a single device. Thus, one of the racks of the vacuum reticle library 17 may be configured identically to the rack of the CFP opener 18, and the alignment stage 22 may be provided in the vacuum reticle library 17.

Figure 11:
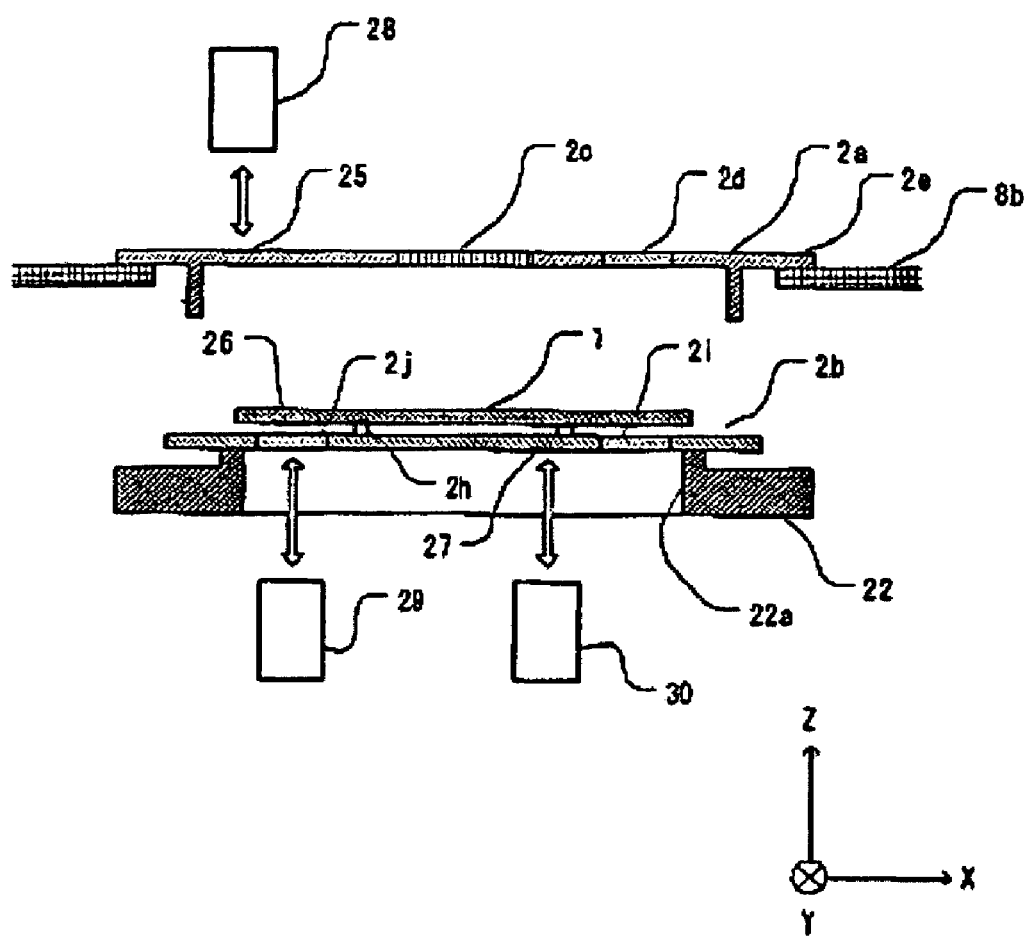
FIG. 11 is a general view of the position measurement device provided in the CFP opener.
Figure 12:
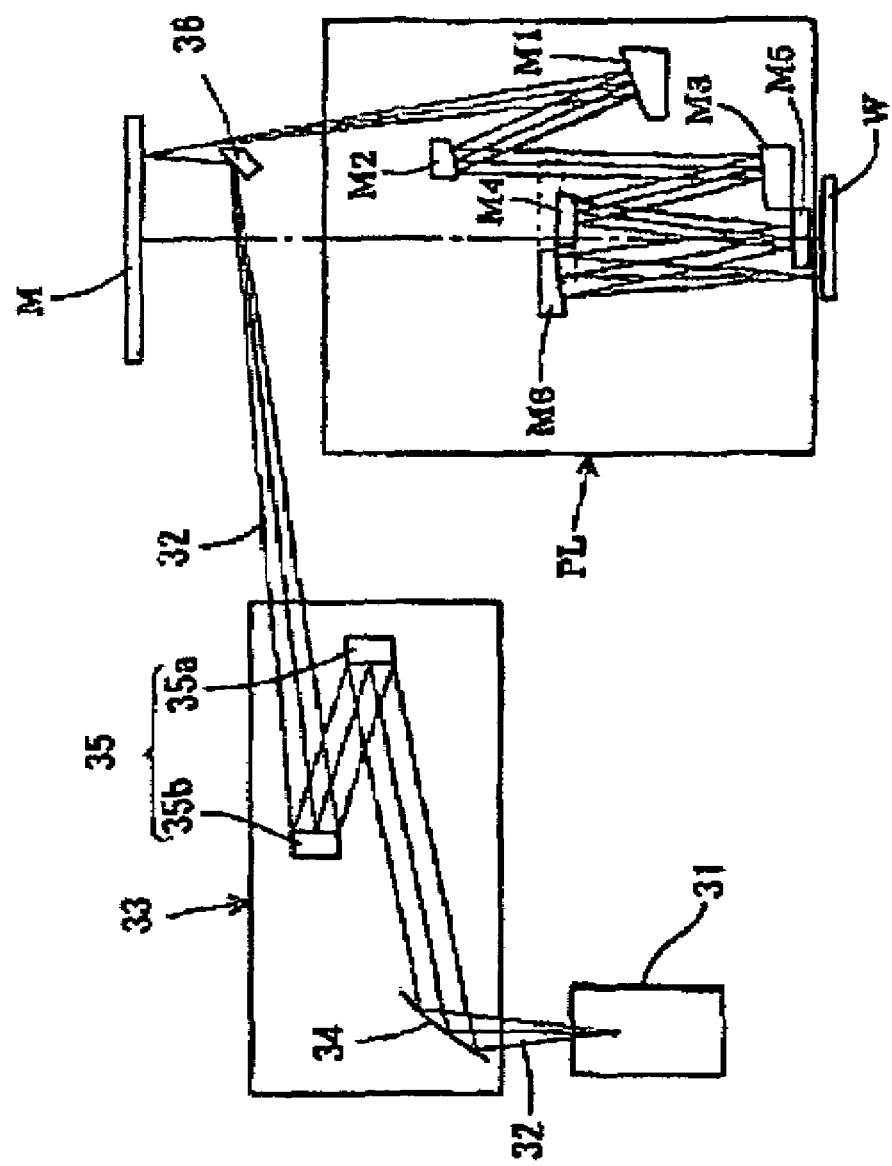
FIG. 12 is a general view of the EUV exposure device.

FIG. 11 is a general view of the position measurement devices provided inside the CFP opener 18. In the present claim, there are provided position measurement devices for the reticle 1, upper lid 2a, and lower lid 2b, and the respective marks for position measurement are provided on the reticle 1, upper lid 2a, and lower lid 2b correspondingly to the position measurement devices. A position measurement mark 25 (shown as 2f in FIG. 3) is provided on the upper lid 2a, a position measurement mark 26 is provided on the reticle 1, and a position measurement mark 27 is provided on the lower lid 2b.

Furthermore, a position measurement device 28 is provided for detecting the position of the position measurement mark 25, a position measurement device 29 is provided for detecting the position of the position measurement mark 26, and a position measurement device 30 is provided for detecting the position of the position measurement mark 27. Examples of the shape of the position measurement marks 25, 26, 27 generally include a cross mark formed by the intersecting line parallel to the X direction shown in FIG. 11 and line parallel to the Y direction and a two-dimensional line-and-space pattern in which line-and-space patterns are arranged in both the X direction and the Y direction. In the present embodiment, such marks are provided in two locations in the Y direction shown in FIG. 11 (for example, see 2f in FIG. 3) on the upper lid 2a, reticle 1, and lower lid 2b. Therefore, each of position measurement devices 28 to 30 comprises two detectors.

The position measurement device 28 measures the position of the upper lid 2a by measuring the position of the position measurement mark 25 when the upper lid 2a assumes a state in which it is suspended on the horizontal plate 18b. The position measurement device 29 measures the position of the position measurement mark 26 formed on the lower surface of the reticle 1 via the through hole 22a and transmission window 2j when the lower lid 2b assumes a state in which it is placed and held on the alignment stage 22, thereby measuring the position of the reticle 1. The position measurement device 30 measures the position of the position measurement mark 27 formed on the lower surface of the lower lid 2b via the through hole 22a and transmission window 2j when the lower lid 2b assumes a state in which it is placed and held on the alignment stage 22, thereby measuring the position of the lower lid 2b.

The structure of the position measurement devices 28, 29, 30 is such that the images of the position measurement marks 25, 26, 27, which have a cross-like shape, are picked up with two-dimensional imaging devices via optical microscopes, thereby detecting the positions of the position measurement marks 25, 26, 27 in the X direction and Y direction. Well-known microscopes that have been used in the conventional exposure devices can be used in such a structure and the explanation thereof is omitted. Furthermore, because the position measurement marks 25, 26, 27 are formed by two, the rotation of the upper lid 2a, reticle 1, and lower lid 2b about the Z axis can be detected.

The alignment procedure implemented after the upper lid 2a and lower lid 2b have been separated by the CFP opener 18 till the reticle is placed and held on the reticle stage will be described below. The position measurement mark 27 on the lower lid 2b separated by the opener 18 is measured with the position measurement device 30. The position measurement device 30 may be a microscope with a relatively low magnification, and a relatively wide mark detection region is preferred. The alignment stage 22 is moved in the X and Y directions and rotated about the z-axis so that the mark 27 measured with the position measurement device 30 be arranged in the prescribed position. Then, the position measurement mark 26 formed on the reticle 1 is measured with the position measurement device 29. This position measurement device is preferably a microscope with a relatively high magnification. In microscopes with high magnification, the mark detection region tends to become relatively narrow, but the mark 26 can be introduced into such relatively narrow detection region by alignment of the mark 27. The alignment stage is moved in the X and Y directions and rotated about the z-axis so that the mark 26 be arranged in the prescribed position based on the measurement results obtained for the mark 26. The reticle 1 and lower lid 2b that were thus positioned are again held by the vacuum robot arm and then carried to the reticle stage and the reticle 1 is fixed to the reticle stage. The reticle 1 is positioned on the reticle stage by using another alignment system, but because the reticle has been aligned, as described hereinabove, before being placed on the reticle stage, the alignment system carried on the reticle stage can have a relatively narrow mark detection region, and the measurement accuracy is easily increased. Furthermore, the alignment can be also conducted by using a vacuum robot arm, without moving the alignment stage 26. In this case, the position of the vacuum robot arm may be adjusted after measuring the position of the alignment mark 27, and then the position of the alignment mark 26 may be measured and the reticle stage may be carried by taking the position measurement results into account. Moreover, sometimes the alignment stage 22 and vacuum robot arm 16 are used together. For example, the alignment in the X and Y direction can be conducted with the vacuum robot arm 16, and the rotation about the Z-axis can be adjusted with the alignment stage 22. In this case, the alignment of the lower lid 2b is implemented by conducting position measurements on the alignment stage 22, then raising the lower lid 2b with the vacuum robot arm, adjusting the positions in the X and Y directions, and then placing on the alignment stage 22. The adjustment of rotation about the Z-axis is carried out with the alignment stage 22 before or after the adjustment with the vacuum robot arm. Then, the alignment mark 26 is measured, the rotation about the Z axis is adjusted with the alignment stage 22, and then the position in the X and Y directions is adjusted with the vacuum robot arm in the course of carrying to the reticle stage, and the reticle is placed on the reticle stage.

The position of the reticle 1 and the position of the lower lid 2b are measured with the above-described object. Furthermore, if the detection region of the position measurement device 29 for measuring the alignment mark 26 provided on the reticle 1 is sufficiently wide and the measurements are always possible, then measurements of the alignment mark 27 provided on the lower lid 2b become unnecessary.

Furthermore, it is preferred that the position of the lower lid 2b be measured after the use of reticle 1 has been completed and before the lower lid 2b is carried to the reticle stage 19a for recovering the reticle 1 from the reticle stage 19a. When the chucking with an electrostatic chuck 24 of the reticle stage 19a is released and the reticle 1 is placed and held on the lower lid 2b, if the mutual arrangement of the reticle 1 and lower lid 2b does not correspond to the appropriate positions, abnormal contact occurs between the reticle 1 and the lower lid 2b (for example, the reticle 1 is not inserted properly between the alignment pins 2g shown in FIG. 3 and assumes a floating state or rubs against them), causing damage of the reticle 1 or dust generation.

In order to prevent it, the mutual relative arrangement of the reticle 1 and lower lid 2b in the case where the lower lid 2b is carried to the reticle stage 19a with the vacuum robot arm 16a and the vacuum robot arm 16a is stopped in the prescribed position is determined by measuring the position of the position measurement mark 17 and determining the position of the lower lid 2b, and the stop position of the vacuum robot arm 16a is corrected according to the displacement. Alternatively, the mutual relative arrangement of the reticle 1 and lower lid 2b in the case where the vacuum robot arm 16a is stopped in the prescribed position is determined, the position of the lower lid 2b is corrected accordingly with the alignment stage 22, and then the lower lid is carried by the vacuum robot 16 to the prescribed position of the reticle stage 19a.

Measuring the position of the upper lid 2a by measuring the position of the position measurement mark 25 is conducted so that the upper lid 2a and lower lid 2b be accurately mated when the use of reticle 1 is completed and the reticle 1 is placed on the lower lid 2b and recovered, or when the upper lid and lower lid are closed and air is introduced in order to prevent dust from entering the above-described pod. Thus, the lower lid 2b is lifted with the vacuum robot arm 16a inside the CFP opener 18 and fit into the upper lid 2a that was suspended on the horizontal plate 18b, but if a displacement occurs between the upper lid 2a and lower lid 2b at this time, the lower lid 2b is not properly mated with the upper lid 2a, and there is a risk of the lids damaging each other or of the abnormal contact generating dust.

Accordingly before the lower lid 2b is fit into the upper lid 2a, the relative positions of the upper lid 2a and lower lid 2b are measured, the position of the vacuum robot arm 16a is adjusted so that the two lids fit each other properly, and the lower lid is then raised. Alternatively, when the alignment stage 22 is provided, the position of the lower lid 2b is adjusted with the alignment stage 22 and the lower lid is then raised with the vacuum robot arm 16a.

Furthermore, in this case, when the reticle 1 is accommodated in the lower lid 2b in an inappropriate position with respect to the lower lid 2b, if the upper lid and lower lid are closed in this state, the reticle can be damaged. Therefore, it is preferred that not only the positions of the upper lid 2a and lower lid 2b, but also the position of the reticle 1 be measured and that measurements be conducted to determine whether or not the reticle 1 has been arranged in the appropriate position with respect to the lower lid 2b. When the reticle position is inappropriate, it is possible to return again to the reticle stage, chuck the reticle, adjust the position of the lower lid, and then place the lower lid anew, or to provide a separate mechanism for changing only the reticle position, or to carry the lower lid directly to the outside of the device through the load lock chamber, without placing the upper lid. In the case of carrying to the outside of the device, without placing the upper lied, the upper lid is also carried to the outside of the device via a separate route. It goes without saying that in the configuration in which the upper lid 2a is not used as the protective member, only the lower lid 2b is provided, and only the patterned surface of the reticle 1 is protected, the alignment of the upper lid 2a and lower lid 2b is unnecessary.

In the explanation hereinabove, the alignment was conducted only with respect to the X and Y directions and rotation about the Z-axis, but the alignment may be also conducted with respect to the Z-axis direction and rotation about the X and Y-axes.

In the explanation provided hereinabove, the EUV exposure device was considered as an example, but the present invention, if necessary, can be also employed in carrying devices of exposure devices other than the EUV exposure devices, inspection devices, and mask cleaning devices.

The invention claimed is:

1. A reticle protection member for protecting at least part of a reticle to be used in an exposure device, the reticle protection member comprising an alignment mark indicating the position of the reticle protection member.

2. The reticle protection member as described in claim 1, wherein the reticle is a reflective-type reticle having a pattern on one surface, wherein the reticle protection member comprises a first member for protecting the surface of the reticle having the pattern and a second member for protecting a surface opposite to the surface having the pattern, and wherein the first and second members each include an alignment mark.

3. The reticle protection member as described in claim 1, wherein the reticle is a reflective-type reticle having a pattern on one surface, and wherein the reticle protection member protects at least the pattern.

4. A reticle carrying device for carrying a reticle, comprising reticle-carrying means for carrying a reticle at least partly protected by a reticle protection member, first position measurement means for measuring the position of the reticle, and second position measurement means for measuring the position of the reticle protection member.

5. The reticle carrying device according to claim 4, wherein the reticle is a reflective-type reticle having a pattern on one surface, wherein the reticle protection member comprises a first member for protecting the surface of the reticle having the pattern and a second member for protecting a surface opposite to the surface having the pattern, and wherein the second position measurement means independently measures the positions of the first member and the second member.

6. The reticle carrying device according to claim 5, further comprising position correction means for correcting the positions of the first member and the reticle based on the position of the reticle and the position of the reticle protection member measured by the first position measurement means and the second position measurement means.

7. The reticle carrying device according to claim 6, wherein the reticle carrying means is configured to carry the reticle protected by the reticle protection member to a reticle stage and to carry the reticle protection member from the reticle stage to another location after the reticle has been loaded on the reticle stage, and is configured to correct the position of the reticle and the reticle protection member or the first member with the position correction means before the reticle is loaded on the reticle stage.

8. The reticle carrying device according to claim 5, having a function of measuring the positions of the first member and the second member and then aligning the first member and the second member and combining them based on the measurement results.

9. The reticle carrying device according to claim 4, wherein the reticle is a reflective-type reticle having a pattern on one surface, and wherein the reticle protection member protects at least the pattern.

10. The reticle carrying device according to claim 4, further comprising position correction means for correcting the positions of the reticle protection member and the reticle based on the position of the reticle and the position of the reticle protection member measured by the first position measurement means and the second position measurement means.

11. The reticle carrying device according to claim 10, wherein the reticle carrying means is configured to carry the reticle protected by the reticle protection member to a reticle stage and to carry the reticle protection member from the reticle stage to another location after the reticle has been loaded on the reticle stage, and is configured to correct the position of the reticle and the reticle protection member or the first member with the position correction means before the reticle is loaded on the reticle stage.

12. The reticle carrying device according to claim 4, wherein the reticle carrying means is configured to carry the reticle protection member to a reticle stage, protecting the reticle with the reticle protection member, and then to carry the reticle protection member and the reticle to recover the reticle from the reticle stage, and is configured to measure the position of the reticle protection member with the second measurement means before the reticle protection member is carried to the reticle stage.

13. An exposure device comprising the reticle-carrying device of claim 4.

14. A method for carrying a reticle to be used in an exposure device, comprising the steps of:
   protecting at least part of the reticle with a protection member;
   measuring the position of the reticle and the position of protection member while the protection member protects at least part of the reticle; and
   removing the reticle from the protection member.

* * * * *